United States Patent
Laskaris et al.

(10) Patent No.: US 6,215,384 B1
(45) Date of Patent: Apr. 10, 2001

(54) MAGNET INCLUDING SHIELDING

(75) Inventors: Evangelos Trifon Laskaris, Niskayuna; Michael Anthony Palmo, Ballston Spa; Michele Dollar Ogle, Burnt Hills, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/419,238

(22) Filed: Oct. 15, 1999

Related U.S. Application Data

(60) Provisional application No. 60/129,441, filed on Apr. 15, 1999, provisional application No. 60/129,438, filed on Apr. 15, 1999, and provisional application No. 60/129,439, filed on Apr. 15, 1999.

(51) Int. Cl.$^7$ .................................................. H01F 5/00
(52) U.S. Cl. ............................................ 335/299; 335/216
(58) Field of Search .................................... 335/216, 299, 335/300, 301; 324/319–321

(56) References Cited

U.S. PATENT DOCUMENTS

| | | | |
|---|---|---|---|
| 4,385,277 | * 5/1983 | Hanley | 324/319 |
| 4,689,591 | * 8/1987 | McDougall | 335/299 |
| 5,517,168 | 5/1996 | Dorri et al. | 335/301 |
| 5,517,169 | 5/1996 | Laskaris et al. | 335/301 |
| 5,565,831 | 10/1996 | Dorri et al. | 335/216 |
| 5,568,102 | 10/1996 | Dorri et al. | 335/216 |
| 5,568,110 | 10/1996 | Dorri et al. | 335/216 |
| 5,570,073 | 10/1996 | Muller | 335/299 |
| 5,574,417 | 11/1996 | Dorri et al. | 335/216 |
| 5,594,401 | 1/1997 | Dorri et al. | 335/216 |
| 5,721,523 | 2/1998 | Dorri et al. | 335/216 |
| 5,801,609 | * 9/1998 | Laskaris et al. | 335/216 |
| 5,874,880 | 2/1999 | Laskaris et al. | 335/216 |
| 5,874,882 | 2/1999 | Laskaris et al. | 335/299 |
| 5,883,558 | 3/1999 | Laskaris et al. | 335/216 |
| 5,900,792 | * 5/1999 | Havens et al. | 335/216 |

OTHER PUBLICATIONS

Laskaris et al., Application entitled "Open Magnet Having Shielding", filed Nov. 24, 1998, S.N. 09/199,096.
Laskaris et al., Application entitled "Open Magnet With Shielding", filed Nov. 24, 1998, S.N. 09/199,095.
Laskaris et al., Application entitled "Apparatus and Magnet For a Superconductive Magnet With Pole Piece", filed Aug. 31, 1999, S.N. 09/385,407.

* cited by examiner

*Primary Examiner*—Lincoln Donovan
(74) *Attorney, Agent, or Firm*—Marvin Snyder; Douglass E. Stoner

(57) ABSTRACT

A magnet, such as a closed, superconductive, magnetic-resonance-imaging (MRI) magnet includes a main coil, a correction coil, and a shielding coil positioned radially outward from the main and correction coils. Two magnetizable members are positioned radially outward from the main and correction coils and radially inward from the shielding coil to shorten the magnet, to supplement the strength, and increase the homogeneity of, the magnetic field created, at least in part, by the main and correction coils and to supplement the shielding provided, at least in part, by the shielding coil.

20 Claims, 2 Drawing Sheets ical reinforcement. The projected cost savings (mainly
MAGNET INCLUDING SHIELDING This application claims priority of: a Provisional Application entitled "Hybrid Shield MRI Magnet" by Evangelos T. Laskaris et al., Serial No. 60/129,441 filed Apr. 15, 1999; a Provisional Application entitled "Short Hybrid Shield MRI Magnet" by Evangelos T. Laskaris et al., Serial No. 60/129,438 filed Apr. 15, 1999; and a Provisional Application entitled "Hybrid Shield Short MRI Magnet" by Evangelos T. Laskaris et al., Serial No. 60/129,439 filed Apr. 15, 1999; and is copending with U.S. patent applications Ser. Nos. 09/419,236 and 09/419,237 by Evangelos T. Laskaris et al, both filed Oct. 15, 1999.

BACKGROUND OF THE INVENTION

The present invention relates generally to a magnet, and more particularly to a magnet having shielding to protect the area around the magnet from stray magnetic fields originating from the magnet.

Magnets are used in diverse applications such as MRI (magnetic resonance imaging) systems. MRI systems include those employing superconductive magnets for medical diagnostics and procedures. Known superconductive MRI magnet designs include those having superconductive main coils each carrying a large, identical electric current in the same direction. The superconductive main coils create a static magnetic field within an MRI imaging volume which typically has the shape of a sphere centered within the magnet's bore where the object to be imaged is placed.

Superconductive magnets having shielding include those having superconductive shielding coils and those having a cylindrical iron shield. The superconductive shielding coils carry electric currents of generally equal amperage, but in an opposite direction, to the electric current carried in the superconductive main coils. The superconductive shielding coils are positioned radially outward from the superconductive main coils to prevent the high magnetic field created by and surrounding the superconductive main coils from adversely interacting with electronic equipment in the vicinity of the magnet. Likewise, the cylindrical iron shield is positioned radially outward from the superconductive main coils to prevent the high magnetic field created by and surrounding the superconductive main coils from adversely interacting with electronic equipment in the vicinity of the magnet.

Superconductive magnets having superconductive shielding coils use nearly twice as much superconductor, and therefore are more expensive, than superconductive magnets having a cylindrical iron shield. Superconductive magnets having a cylindrical iron shield are too heavy to be placed in medical buildings without expensive structural reinforcement. In addition, the presence of a thick iron shield close to the magnet adversely affects the field homogeneity of a short magnet employing bucking coils or iron rings. What is needed is a magnet having shielding which is not as expensive or as heavy as known designs.

BRIEF SUMMARY OF THE INVENTION

In a first expression of the invention, a magnet includes a longitudinally-extending axis, at least one main coil, at least one correction coil, at least one shielding coil, and at least two magnetizable members. The at least one main coil is generally coaxially aligned with the axis and carries an electric current in a first direction. The at least one correction coil is generally coaxially aligned with the axis, longitudinally spaced apart from the at least one main coil, and carries an electric current in an opposite direction to the first direction. The at least one shielding coil is generally coaxially aligned with the axis, is positioned radially outward from the at least one main and correction coils, and carries an electric current in the previously-mentioned opposite direction. The at least two magnetizable members are not carrying an electric current, are longitudinally spaced apart from each other, are positioned radially outward from the at least one main and correction coils, and are positioned radially inward from the at least one shielding coil.

In a second expression of the invention, a closed, superconductive, magnetic-resonance-imaging (MRI) magnet includes a longitudinally-extending axis, longitudinally-outermost superconductive first and second main coils, superconductive first and second correction coils, superconductive first and second shielding coils, and annularly-cylindrical first and second magnetizable members. The first and second main coils are generally coaxially aligned with the axis and carry an electric current in a first direction. The first and second correction coils are generally coaxially aligned with the axis, are positioned longitudinally between the first and second main coils, and carry an electric current in an opposite direction to the first direction. The first and second shielding coils are generally coaxially aligned with the axis, are positioned radially outward from the first and second main and correction coils, and carry an electric current in the previously-mentioned opposite direction. The first and second magnetizable members are not carrying an electric current, are positioned radially outward from the first and second main and correction coils, and are positioned radially inward from the first and second shielding coils. The first magnetizable member at least partially longitudinally overlaps the first main coil, and the second magnetizable member at least partially longitudinally overlaps the second main coil.

Several benefits and advantages are derived from the invention. The at least two (or the first and second) magnetizable members, being located radially inward from the at least one (or the first and second) shielding coil, supplement the strength, and increase the homogeneity of, the magnetic field created, at least in part, by the at least one (or the first and second) main and correction coils. The at least two (or the first and second) magnetizable members, being located radially outward from the at least one (or the first and second) main and shielding coils, provide extra shielding and thus supplement the shielding provided, at least in part, by the at least one (or the first and second) shielding coil. The combined positioning of the shielding coils, the magnetizable members, and the main and correction coils can be arranged, as is within the skill of the artisan, to reduce the longitudinally-outward EM (electromagnetic) forces experienced by the longitudinally-outermost main coils. The magnetizable members play a key role in that effect. The at least one (or the first and second) correction coil will shorten the magnet (typically by about ten percent). For a 1.5 Tesla superconductive magnet, wherein the at least two (or the first and second) magnetizable members are annularly-cylindrical iron members, engineering calculations show superconductor use is reduced by at least 20% while magnet weight is increased by about 30% to generally 11,000 pounds. It is noted that a magnet weighing 11,000 pounds easily can be placed in medical buildings without expensive structural reinforcement. The projected cost savings (mainly in saved superconductor costs) over a similar magnet which relies only on its bigger superconductive shielding coils for shielding is about 10,000 US dollars. The calculated weight of a similar magnet which relies only on iron for its shielding is about 60,000 pounds which prevents it from being placed in medical buildings without expensive structural reinforcement.

DETAILED DESCRIPTION OF THE INVENTION

Figure 1:
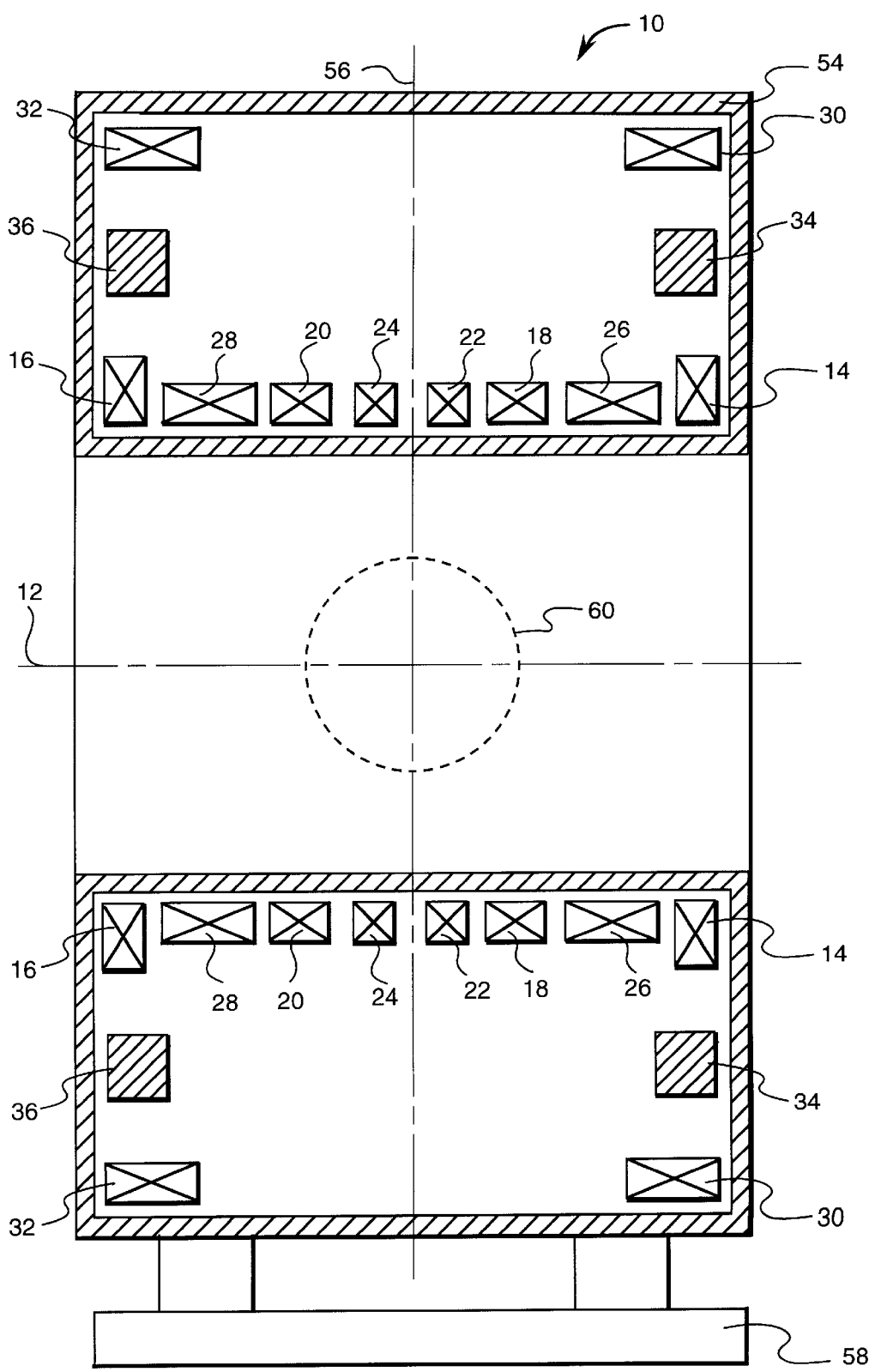
FIG. 1 is a schematic, cross-sectional, side-elevational view of a first embodiment of the magnet of the invention.
Figure 2:
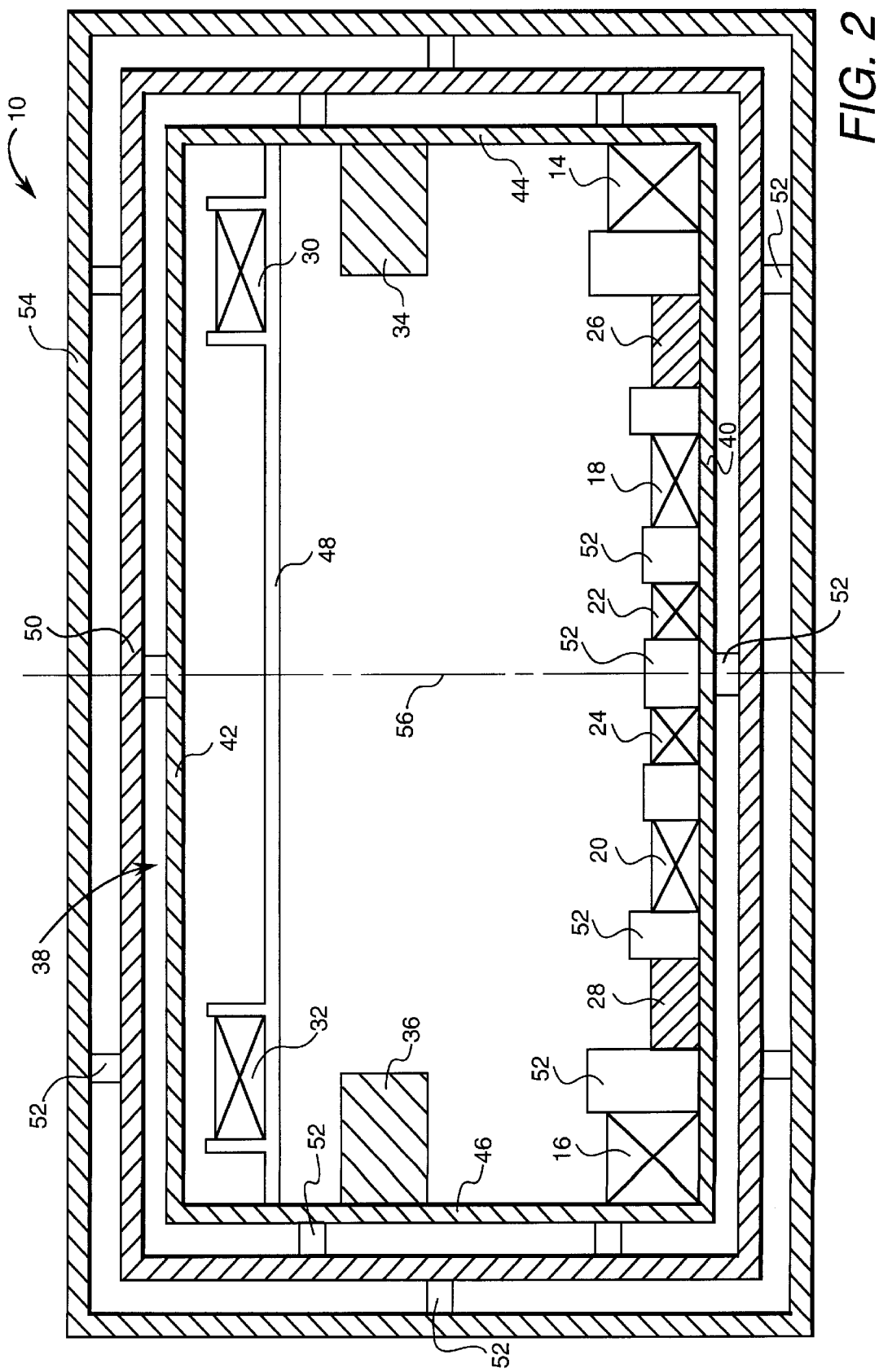
FIG. 2 is a more detailed view of the upper portion of the magnet of FIG. 1.

Referring now to the drawings, FIGS. 1 and 2 show a first embodiment of the magnet 10 of the present invention. In one example, magnet 10 is a closed superconductive magnet. In one application, magnet 10 is part of an MRI (magnetic resonance imaging) system (not shown) used for medical diagnostics and procedures.

In one expression of the first embodiment of the invention, a magnet 10 includes a longitudinally-extending axis 12, at least one main coil 14, 16, 18, 20, 22, and 24 (hereinafter expressed as 14–24), at least one correction coil 26 and 28, at least one shielding coil 30 and 32, and at least two magnetizable members 34 and 36 which are not carrying an electric current. The at least one main coil 14–24 is generally coaxially aligned with the axis 12 and carries an electric current in a first direction. The first direction is defined to be either a clockwise or a counterclockwise circumferential direction about the axis 12 with any slight longitudinal component of current direction being ignored. The at least one correction coil 26 and 28 is generally coaxially aligned with the axis 12, is longitudinally spaced apart from the at least one main coil 14–24, and carries an electric current in an opposite direction to the previously-described first direction. The at least one shielding coil 30 and 32 is generally coaxially aligned with the axis 12, is disposed radially outward from the at least one main and correction coils 14–24 and 26–28 (also expressed as 26 and 28), and carries an electric current in the previously-described opposite direction. The at least two magnetizable members 34 and 36 are longitudinally spaced apart from each other, are disposed radially outward from the at least one main and correction coils 14–24 and 26–28, and are disposed radially inward from the at least one shielding coil 30 and 32.

In one example, the at least one shielding coil 30 and 32 consists of at least one superconductive shielding coil. In another example, the at least one main coil 14–24 consists of at least one superconductive main coil, and the at least one correction coil 26 and 28 consists of at least one superconductive correction coil. Superconductive cooling may be achieved by employing cryogenic fluids and/or cryocooler coldheads, and the like, as is known to the artisan. As seen in FIG. 2, in one construction, magnet 10 includes an annularly-cylindrical helium (or other cryogenic fluid) vessel 38 having a radially-inner wall 40, a radially-outer wall 42, and first and second longitudinal end walls 44 and 46. The helium vessel 38 encloses the at least one main, correction, and shielding coils 14–24, 26–28, and 30–32 (also expressed as 30 and 32) and the at least two magnetizable members 34 and 36. The radially-inner wall 40 defines a coil support for said at least one main and correction coils 14–24 and 26–28, and the at least one main and correction coils 14–24 and 26–28 are wound around the radially-inner wall 40. At least one of the at least two magnetizable members 34 and 36 is attached to the first longitudinal end wall 44, and at least one other of the at least two magnetizable members 34 and 36 is attached to the second longitudinal end wall 46. The at least one shielding coil 30 and 32 is wound around a coil support 48 which is attached to the first and second longitudinal end walls 44 and 46. At least one thermal shield 50 is spaced apart from (using conventional spacers 52) and generally surrounds the helium vessel 38, and a vacuum enclosure 54 is spaced apart from (using conventional spacers 52) and encloses the at least one thermal shield 50. It is seen from FIG. 1 that magnet 10 is generally symmetrical about a plane (seen on edge as a dashed line 56) which is perpendicular to the axis 12 and which is disposed equidistant from the longitudinal ends of the vacuum enclosure 54. The vacuum enclosure 54 is supported by a floor mount 58. It is noted that, when there is more than one at least one main and/or correction coil 14–24 and 26–28, conventional spacers 52 may also be used to longitudinally separate and position these coils 14–24 and 26–28.

In one design, at least one of the at least two magnetizable members 34 and 36 at least partially longitudinally overlaps or underlaps at least one of the at least one main or shielding coils 14–24 and 30–32. In another design, at least one of the at least two magnetizable members 34 and 36 at least partially longitudinally overlaps at least one of the at least one main coil 14–24 and at least partially longitudinally underlaps at least one of the at least one shielding coil 30 and 32. In a further design, at least one of the at least two magnetizable members 34 and 36 completely longitudinally overlaps at least one of the at least one main coil 14–24, and, in one variation, at least one of the at least two magnetizable members 34 and 36 also at least partially longitudinally underlaps at least one of the at least one shielding coil 30 and 32. In one construction, the at least two magnetizable members 34 and 36 are at least two annularly-cylindrical magnetizable members generally coaxially aligned with the axis 12.

In another expression of the first embodiment of the invention, a closed, superconductive, magnetic-resonance-imaging (MRI) magnet 10 includes a longitudinally-extending axis 12, longitudinally-outermost superconductive first and second main coils 14 and 16, superconductive first and second correction coils 26 and 28, superconductive first and second shielding coils 30 and 32, and annularly-cylindrical first and second magnetizable members 34 and 36 which are not carrying an electric current. The first and second main coils 14 and 16 are generally coaxially aligned with the axis 12 and carry an electric current in a first direction, as previously defined. The first and second correction coils 26 and 28 are generally coaxially aligned with the axis 12, are disposed longitudinally between the first and second main coils 14 and 16, and carry an electric current in an opposite direction to the previously-described first direction. The first and second shielding coils 30 and 32 are generally coaxially aligned with the axis 12, are disposed radially outward from the first and second main and correction coils 14 & 16 and 26 & 28, and carry an electric current in the previously-described opposite direction. The first and second magnetizable members 34 and 36 are disposed radially outward from the first and second main and correction coils 14 & 16 and 26 & 28 and are disposed radially inward from the first and second shielding coils 30 and 32. The first magnetizable member 34 at least partially longitudinally overlaps the first main coil 14, and the second magnetizable member 36 at least partially longitudinally overlaps the second main coil 16.

As seen in FIG. 2, in one construction, magnet 10 includes an annularly-cylindrical helium (or other cryogenic fluid) vessel 38 having a radially-inner wall 40, a radially-outer wall 42, and first and second longitudinal end walls 44 and 46. The helium vessel 38 encloses the first and second main, correction, and shielding coils 14 & 16, 26 & 28, and 30 & 32 and the first and second magnetizable members 34 and 36. The radially-inner wall 40 defines a coil support for the first and second main and correction coils 14 & 16 and 26 & 28, and the first and second main and correction coils 14 & 16 and 26 & 28 are wound around the radially-inner wall 40. The first magnetizable member 34 is attached to the first longitudinal end wall 44, and the second magnetizable member 36 is attached to the second longitudinal end wall 46. The first and second shielding coils 30 and 32 are wound around a coil support 48 which is attached to the first and second longitudinal end walls 44 and 46.

In one design, the first shielding coil 30 at least partially longitudinally overlaps the first main coil 14, and the second shielding coil 32 at least partially longitudinally overlaps the second main coil 16. In another design, the magnet 10 includes superconductive third and fourth main coils 18 and 20 generally coaxially aligned with the axis 12, disposed radially inward from the first and second magnetizable members 34 and 36, disposed longitudinally between the first and second correction coils 26 and 28, and carrying an electric current in the previously-described first direction. In one variation, the magnet 10 also includes superconductive fifth and sixth main coils 22 and 24 generally coaxially aligned with the axis 12, disposed radially inward from the first and second magnetizable members 34 and 36, disposed longitudinally between the third and fourth main coils 18 and 20, and carrying an electric current in the previously-described first direction. In one example, all of the coils 14–24 carrying an electric current in the previously-described first direction are disposed radially inward from the first and second magnetizable members 34 and 36. In one design, the first and second shielding coils 30 and 32 are the only coils carrying an electric current in the previously-described opposite direction that are disposed radially outward from the first and second magnetizable members 34 and 36. In another design, the first and second correction coils 26 and 28 are the only coils carrying an electric current in the previously-described opposite direction that are disposed radially inward from the first and second magnetizable members 34 and 36. In an additional design, the first and second magnetizable members 34 and 36 are the only magnetizable members of the magnet 10 not carrying an electric current that are disposed radially inward from the first and second shielding coils 30 and 32 and radially outward from the first and second main and correction coils 14 & 16 and 26 & 28. In one construction, the first and second magnetizable members 34 and 36 are generally coaxially aligned with the axis 12.

It is noted that those skilled in the art, using computer simulations based on conventional magnetic field analysis techniques, and using the teachings of the present invention, can design a shielded superconductive magnet 10 of a desired magnetic field strength, a desired level of magnetic field inhomogeneity, and a desired level of shielding (i.e., a desired position of the 5 Gauss stray field from the center of the imaging volume 60 [shown as a dashed circle in FIG. 1] of the superconductive magnet).

The at least two (or the first and second) magnetizable members 34 and 36, being located radially inward from the at least one (or the first and second) shielding coil 30 and 32, supplement the strength, and increase the homogeneity of, the magnetic field created, at least in part, by the at least one (or the first and second) main and correction coils 14–24 (or 14 and 16) and 26 and 28. The at least two (or the first and second) magnetizable members 34 and 36, being located radially outward from the at least one (or the first and second) main and correction coils 14–24 (or 14 and 16) and 26 and 28, provide extra shielding and thus supplement the shielding provided, at least in part, by the at least one (or the first and second) shielding coil 30 and 32. The at least one (or the first and second) correction coil 26 and 28 will shorten the magnet (typically by about ten percent). For a 1.5 Tesla superconductive magnet, wherein the at least two (or the first and second) magnetizable members 34 and 36 are annularly-cylindrical iron members, engineering calculations show superconductor use is reduced by at least 20% while magnet weight is increased by about 30% to generally 11,000 pounds. It is noted that a magnet weighing 11,000 pounds easily can be placed in medical buildings without expensive structural reinforcement. The projected cost savings (mainly in saved superconductor costs) over a similar magnet which relies only on its bigger superconductive shielding coils for shielding is about 10,000 US dollars. The calculated weight of a similar magnet which relies only on iron for its shielding is about 60,000 pounds which prevents it from being placed in medical buildings without expensive structural reinforcement.

In certain applications, as can be appreciated by the artisan, the magnetizable members 34 and 36 can be a pair or multiple radially-spaced-apart pairs of rings. It is noted that if a full-longitudinal-length cylinder replaced the magnetizable members, this would cause homogeneity problems because the shielding coils 30 and 32 contribute to homogeneity.

Although not shown in the figures, engineering calculations show that first and second magnetizable rings (not shown in the figures) can be substituted for the first and second correction coils 26 and 28 to also shorten the magnet. The first and second magnetizable rings should result in a net longitudinally-inward em force experienced by the first and second main coils 14 and 16 thereby removing the em force previously experienced by the first and second longitudinal end walls 44 and 46. Engineering calculations also show that magnet weight and superconductor savings (but not magnet shortening) can be achieved by eliminating the first and second correction coils 26 and 26 and by substituting a magnetizable member (not shown in the figures) for the first and second magnetizable members 34 and 36. Such magnetizable member extends longitudinally from the first longitudinal end wall 44 to the second longitudinal end wall 46, has a radial thickness with a reduced radial-thickness section extending from the plane 56 longitudinally outward generally half way to the first and second longitudinal end walls 40 and 42, and has a radially-inward-facing surface with a concave portion extending from the plane 56 longitudinally outward generally half way to the first and second longitudinal end walls 40 and 42.

The foregoing description of two expressions of a first embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. A magnet comprising:
a) a longitudinally-extending axis;
b) at least two main separated coils coaxially aligned with said axis and carrying an electric current in a first direction;

c) at least one inner magnetizable member which is coaxially aligned with said axis, longitudinally spaced apart from and intermediate said at least two main coils;

d) at least one shielding coil coaxially aligned with said axis, disposed radially outward from said at least two main e) at least two magnetizable members which are not carrying an electric current, which are longitudinally spaced apart from each other, which are disposed radially outward from said at least two main coils and said at least one inner magnetizable member, and which are disposed radially inward from said at least one shielding coil;

f) said at least two magnetizable members being cylindrical members, interposed between said at least one main and correction coils and said at least one shielding coil.

2. The magnet of claim 1, wherein said at least one inner magnetizable member is at least two correction coils carrying an electric current in said opposite direction.

3. The magnet of claim 2, wherein said at least two main coils and said said at least one correction coil are superconductive.

4. The magnet of claim 2, wherein at least one of said at least two magnetizable members at least partially longitudinally overlaps or underlaps said at least two main coils or said at least one shielding coil.

5. The magnet of claim 4, wherein at least one of said at least two magnetizable members at least partially longitudinally overlaps at least one of said at least one main coil and at least partially longitudinally underlaps at least one of said at least one shielding coil.

6. The magnet of claim 4, wherein at least one of said at least two magnetizable members completely longitudinally overlaps said at least two main coils; and said magnet further includes a cryogenic vessel enclosing said at least two main coils and said correction and shielding coils, and including two longitudinal end walls, one of said at least two magnetizable members being secured to each of said end walls and extending toward each other.

7. The magnet of claim 6, wherein said at least two magnetizable members at least partially longitudinally underlaps at least one of said at least one shielding coil.

8. The magnet of claim 1, wherein said at least two magnetizable members are coaxially aligned with said axis.

9. The magnet of claim 8, wherein said radially-inner wall defines a coil support for said at least one main and correction coils, and wherein said at least one main and correction coils are wound around said radially-inner wall.

10. The magnet of claim 9, also including an annularly-cylindrical vessel having a radially-inner wall, a radially-outer wall, and first and second longitudinal end walls, wherein said cryogenic vessel encloses said at least two main, and said correction, and said shielding coils and said at least two magnetizable members are attached to said longitudinal end walls.

11. A closed, superconductive, magnetic-resonance-imaging (MRI) magnet including a cryogenic vessel and magnetic components therein comprising:

a) a longitudinally-extending axis and a plane perpendicular to said axis and dividing said cryogenic vessel into two equal halves;

b) longitudinally-outermost from said plane superconductive first and second main coils coaxially aligned with said longitudinally-extending axis and carrying an electric current in a first direction;

c) superconductive first and second inner magnetizable members coaxially aligned with said axis, disposed longitudinally between said first and second main coils;

d) superconductive first and second shielding coils coaxially aligned with said axis, disposed radially outward from said first and second main and correction coils, and carrying an electric current in said opposite direction; and e) annularly-cylindrical first and second outer magnetizable members which are not carrying an electric current, which are disposed radially outward from said first and second main and inner magnetizable members, and which are disposed radially inward from said first and second shielding coils; wherein said first magnetizable member at least partially longitudinally overlaps said first main coil and wherein said second magnetizable member at least partially longitudinally overlaps said second main coil.

12. The magnet of claim 11, wherein said first shielding coil at least partially longitudinally overlaps said first main coil and wherein said second shielding coil at least partially longitudinally overlaps said second main coil.

13. The magnet of claim 11, wherein said inner magnetizable members are correction coils carrying an electric current in an opposite direction to said first direction, and all of said coils carrying an electric current in said first direction are disposed radially inward from said first and second magnetizable members.

14. The magnet of claim 13, wherein said first and second outer magnetizable members are coaxially aligned with said axis.

15. The magnet of claim 14, also including superconductive third and fourth main coils coaxially aligned with said axis, disposed radially inward from said first and second outer magnetizable members, disposed longitudinally between said first and second correction coils, and carrying an electric current in said first direction.

16. The magnet of claim 15, also including superconductive fifth and sixth main coils generally coaxially aligned with said axis, disposed radially inward from said first and second outer magnetizable members, disposed longitudinally between said third and fourth main coils, and carrying an electric current in said first direction.

17. The magnet of claim 16, wherein said first and second correction coils are the only coils carrying an electric current in said opposite direction that are disposed radially inward from said first and second outer magnetizable members.

18. The magnet of claim 17, wherein said first and second shielding coils are the only coils carrying an electric current in said opposite direction that are disposed radially outward from said first and second outer magnetizable members.

19. The magnet of claim 11, wherein said cryogenic vessel has a radially-inner wall, a radially-outer wall, and first and second longitudinal end walls, wherein said cryogenic vessel encloses said first and second main and shielding coils, said first and second inner magnetizable members and said first and second outer magnetizable members, wherein said radially-inner wall defines a coil support for said first and second main and correction coils, and wherein said first and second main and correction coils are wound around said radially-inner wall.

20. The magnet of claim 19, wherein said first outer magnetizable member is attached to said first longitudinal end wall and wherein said second outer magnetizable member is attached to said second longitudinal end wall.

* * * * *